VOLTAGE TO FREQUENCY CONVERTER

Filed Dec. 20, 1968 2 Sheets-Sheet 1

INVENTOR,
DONALD C. LOKERSON
BY Carl Levy
ATTORNEYS

VOLTAGE TO FREQUENCY CONVERTER

Filed Dec. 20, 1968 2 Sheets-Sheet 2

INVENTOR,
DONALD C. LOKERSON

BY Carl Levy

ATTORNEYS 3,559,096

VOLTAGE TO FREQUENCY CONVERTER

Donald C. Lokerson, New Carrollton, Md., assignor to the United States of America as represented by the Administrator of the National Aeronautics and Space Administration Filed Dec. 20, 1968, Ser. No. 785,546
Int. Cl. H03k 3/281
U.S. Cl. 331—113 11 Claims

ABSTRACT OF THE DISCLOSURE

A voltage controlled, variable frequency relaxation oscillator includes a pair of metal oxide semiconductor field effect transistors (MOSFET's) feeding variable currents to transistors comprising the oscillator. The gate electrodes of the MOSFET's are connected in parallel with a frequency controlling signal source to provide a high impedance to the source. To compensate for the tendency of the MOSFET's to produce a nonlinear oscillator output frequency as a function of source signal level, special circuitry is provided. To maintain the oscillator response constant as a function of temperature and compensate for variations in the characteristics of the MOSFET's as a function of temperature, a regulator circuit including a MOSFET as a voltage reference source is provided.

Figure 1:
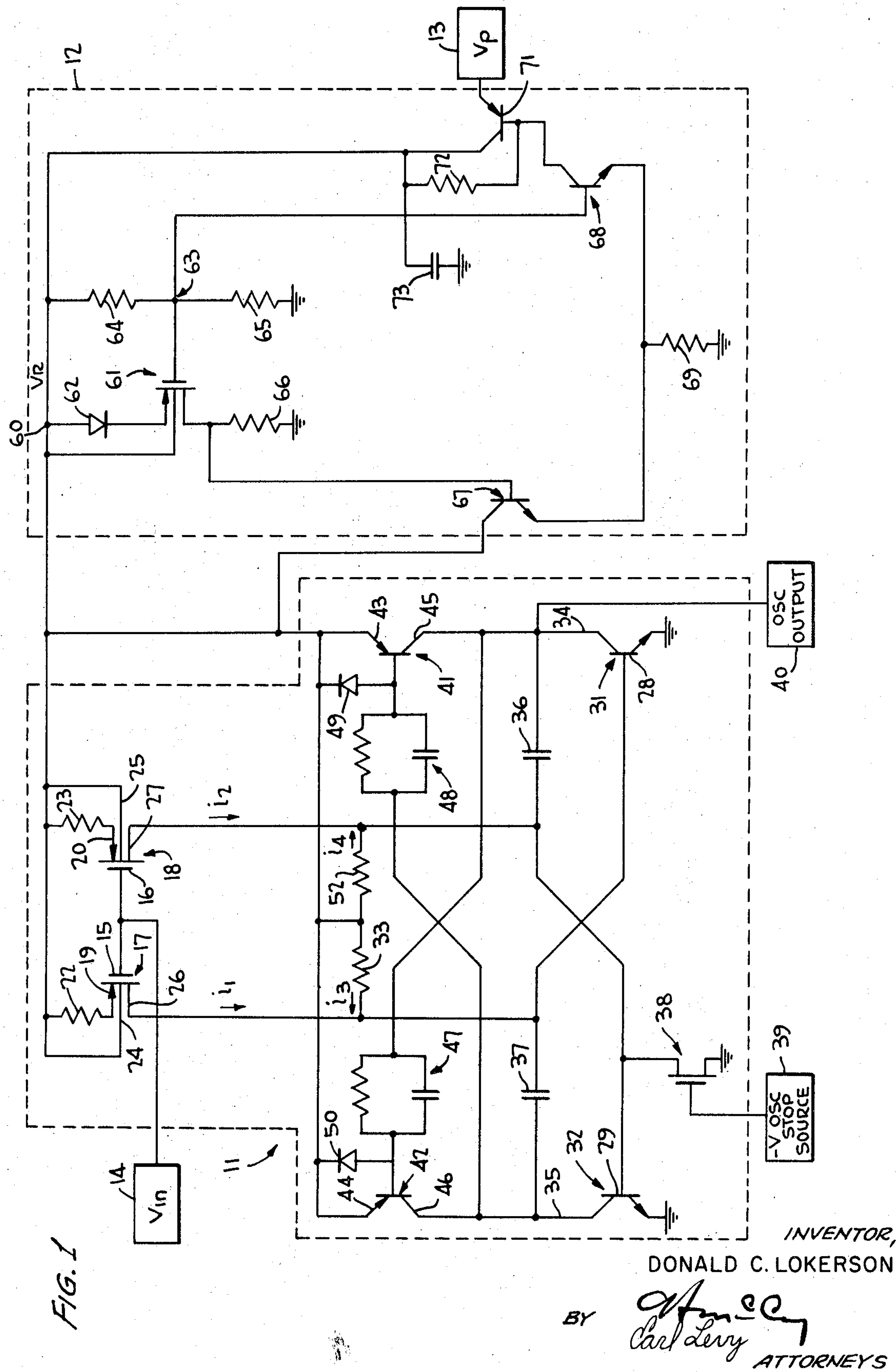

The invention described herein was made by an employee of the United States Government and may be manufactured and used by or for the Government for governmental purposes without the payment of any royalties thereon or therefor.

The present invention relates generally to oscillators and, more particularly, to a relaxation oscillator including a metal oxide semiconductor field effect transistor (MOSFET) for controlling the current applied to switching elements of the oscillator. A further aspect of the invention relates to voltage regulator circuits and, more particularly, to a voltage regulator employing a MOSFET as a reference voltage source. Still a further aspect of the invention relates to a voltage controlled relaxation oscillator and regulator circuit therefor, each of which includes MOSFET's.

In the telemetering art, variable frequency, voltage controlled oscillators, of the relaxation type, have been extensively employed. Generally, such oscillators have employed voltage sensitive magnetic core structures driven by a variable amplitude voltage source through an amplifier to provide impedance isolation between a signal source and the oscillator. Another technique has utilized bipolar transistors to drive current controlled multivibrators; the bipolar transistors being provided to isolate the relatively low impedance of the multivibrator from the variable amplitude signal source.

The magnetic core oscillators and multivibrators driven by bipolar transistors have nonlinear operating characteristics which often preclude the derivation of a linear output frequency versus input signal amplitude response and thereby require frequency versus amplitde compensation. In addition, magnetic core oscillator circuits have nonlinear temperature characteristics for which special circuitry must be provided to maintain a constant output frequency versus input voltage response. Bipolar transistor networks having a sufficiently high input impedance to preclude loading of the variable amplitude source do not accurately follow square-wave type inputs but have a tendency to smooth or integrate one of the edges of the square wave. Changing the shape of the signal input voltage to the oscillator, of course, results in an inaccurate output frequency versus input voltage response.

In accordance with one aspect of the present invention, there is provided a new and improved variable frequency relaxation oscillator having a linear output frequency versus input voltage relationship, as well as a high input impedance to a variable amplitude frequency determining driving source. The high input impedance is provided by connecting the source to the gate electrodes of a pair of MOSFET's, one MOSFET being provided for the input or control electrode of each bipolar transistor comprising the oscillator circuit switching elements. The current supplied to the transistor control electrodes by the MOSFET's is determined by the source voltage which thereby is an important factor in determining the oscillator frequency. While MOSFET's have exceptionally high input impedances, the voltage input versus current output response thereof is nonlinear, being approximately a square law input versus output response. Hence, it would appear that establishing a linear output frequency versus input voltage response for a relaxation oscillator driven by a pair of MOSFET's would be difficult to achieve. It has been found, however, that the linear output frequency versus input voltage response can be approached by appropriately adjusting the impedance levels of the source drain networks of the MOSFET's and by shunting the source drain path of one of the MOSFET's with an impedance having a suitable value.

In accordance with another aspect of the present invention, maximum isolation between the input source and the bodies of the MOSFET's is provided by connecting the bodies to a potential different from the voltage of either the source of drain electrodes of the MOSFET's. This configuration is in contrast with known prior art circuits, wherein the body of a MOSFET was short circuited to either the source or drain electrode. It has been found that leakage between the drain and body electrodes can be minimized by directly connecting the body to the highest voltage in the circuit, rather than to either the source or drain electrode. In the present application, the sources of the two MOSFET's are connected in circuits different from the body so that the sources can provide different currents to the bipolar transistors in the variable frequency, relaxation oscillator.

As indicated supra, the switching elements of the relaxation oscillator are a pair of bipolar transistors. The bases and collectors of the bipolar transistors are cross coupled by a pair of capacitors to establish the regenerative effect in a well known manner. Connected in the emitter collector path of each of the bipolar transistors is a further bipolar transistor, of a complementary type to the first named transistors. By employing the complementary transistor arrangement, which is not necessarily critical to the invention, the maximum signal voltage to which the circuit can respond is increased compared to circuits wherein resistors are provided in the collector circuits of the switching transistors comprising the oscillator.

The power supply voltage for the oscillator of the present invention must be maintained constant as a function of input signal level to the MOSFET's. If the oscillator supply voltage is not maintained constant, the oscillator output frequency varies so that an accurate indication of the input voltage to the MOSFET's is not correlated with the oscillator frequency. Hence, the MOSFET source gate voltage characteristics must be maintained constant despite variations of input voltage magnitude. Another problem in maintaining a constant output frequency versus input voltage characteristics arises because the source gate voltage characteristics of MOSFET's have a tendency to vary as a function of environmental temperature and radiation level.

In accordance with another aspect of the present invention, the supply voltage for the oscillator is maintained constant with a circuit including a MOSFET as a voltage reference device. In particular, the source drain path of the regulator MOSFET is connected in shunt with the power supply network and functions as a voltage reference, similarly to a Zener diode. The source drain impedance of the regulator circuit follows variations in the source drain impedance of the oscillator MOSFET's as a function of temperature and radiation level to assist in providing an oscillator frequency versus voltage that is not materially affected by temperature or radiation.

The reference voltage established by the regulator MOSFET forms one input to a differential amplifier, the other input of which is responsive to a percentage of the regulator output voltage. The difference amplifier responds to the reference voltage developed across the MOSFET of the regulator and the regulator output voltage to maintain the oscillator input supply voltage constant as a function of load current.

In accordance with one embodiment, increased gain is provided for the regulator differential amplifier network by driving one input of the amplifier with the drain voltage of the regulator MOSFET, the gate electrode of which is responsive to the regulator output. Thereby, the differential amplifier of the regulator circuit responds to a larger difference voltage as variations in the regulator output occur, whereby a greater degree of regulation is achieved. In accordance with another aspect of the invention, the regulator circuit includes at least one diode in the source circuit of the MOSFET thereof. The diode provides additional temperature compensation, and adjusts the regulator voltage level so that the power supply voltage to the oscillator compensates for variations of the oscillator MOSFET's particularly when they are operating at low current levels.

A further feature of the MOSFET regulator, for general application, is that the regulator output voltage temperature coefficient can be changed at will in a facile manner. In particular, the temperature coefficient can be varied merely by changing the value of a load resistor in the MOSFET source drain network. By changing the load resistor the MOSFET current level is affected, which controls the MOSFET voltage temperature characteristics. This is in contrast to prior art Zener diode circuits which have fixed temperature coefficients or variable temperature coefficients only if an additional temperature sensitive element is connected in the network.

It is, accordingly, an object of the present invention to provide a new and improved voltage controlled relaxation oscillator employing semiconductor elements.

Another object of the invention is to provide a new and improved voltage controlled relaxation oscillator having a high input impedance to a variable voltage source and linear frequency versus input voltage characteristics.

A further object of the invention is to provide a semiconductor, voltage controlled relaxation oscillator having a linear output frequency versus input voltage characteristic and employing MOSFET's for controlling the current applied to the oscillator switching elements.

Still another object of the present invention is to provide a new and improved voltage controlled relaxation semiconductor oscillator having a high input impedance to an external source, linear output frequency versus input voltage characteristics and capable of operating over a frequency range in excess of two decades.

Still another object of the invention is to provide a voltage controlled, variable frequency relaxation oscillator employing MOSFET's, wherein the temperature and radiation characteristics of the MOSFET's are compensated with a power supply circuit including as a voltage reference source another MOSFET.

Still another object of the invention is to provide a new and improved voltage controlled relaxation oscillator including MOSFET's wherein the nonlinear input versus output current responses thereof are compensated so that the oscillator provides a linear output frequency versus input voltage response and the temperature and radiation characteristics of the MOSFET's are compensated with relatively simple circuitry in a power supply network.

Yet a further object of the invention is to provide a new and improved semiconductor power supply circuit, particularly adapted to function with MOSFET circuitry.

Another object of the invention is to provide a power supply circuit including a MOSFET as a reference voltage source.

Yet another object of the invention is to provide a D.C. power supply network including a differential amplifier driven by a MOSFET which functions both as an amplifying and reference voltage device.

Still a further object of the present invention is to provide a D.C. power supply including a MOSFET as a voltage reference source in combination with relatively simple circuitry for matching the MOSFET output voltage level to the voltage level of a circuit being driven by the regulator.

Figure 3:
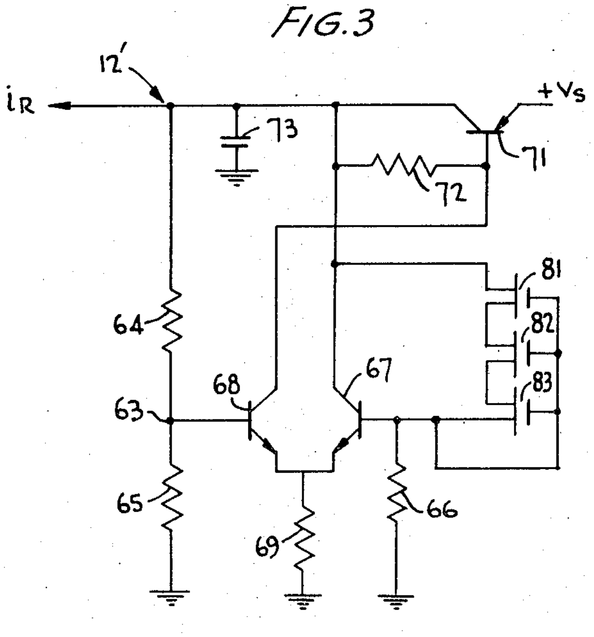
Figure 4:
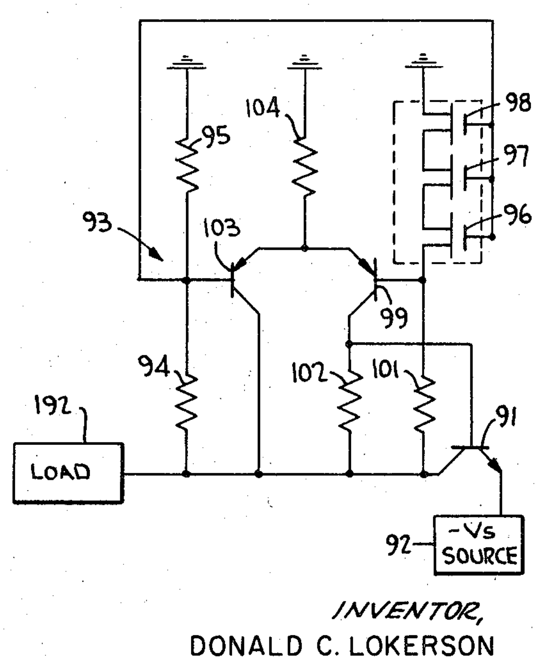

The above and still further objects, features and advantages of the present invention will become apparent upon consideration of the following detailed description of several specific embodiments thereof, especially when taken in conjunction with the accompanying drawings, wherein:

FIG. 1 is a circuit diagram of one preferred embodiment of the present invention;

FIGS. 2*a*–2*e* are waveforms helpful in describing the manner by which the oscillator portion of the circuit of FIG. 1 functions;

FIG. 3 is a circuit diagram of a modified form of the regulator included in the circuit of FIG. 1; and FIG. 4 is a circuit diagram of another form of a regulator in accordance with the present invention, particularly adapted to be utilized with negative, rather than positive voltage supplies.

Reference is now made to FIG. 1 of the drawings wherein a regulated positive D.C. voltage is supplied to voltage controlled, variable frequency relaxation oscillator 11 by voltage regulator 12 which is in turn driven by unregulated, positive D.C. power supply 13. As seen infra, the characteristics of regulator 12 are matched with those of oscillator 11, whereby temperature and radiation level characteristics of elements in the oscillator are compensated for by the output supply voltage of the regulator.

The frequency derived from oscillator 11 is controlled by a variable voltage signal source 14, usually having a regulatively high output impedance. The voltage of source 14, generally susceptible to variations of between 0 and +5.5 volts, is applied in parallel to gate electrodes 15 and 16 of P-channel MOSFET's 17 and 18, respectively. Source electrodes 19 and 20 of MOSFET's 17 and 18 are connected to the regulated D.C. output voltage of regulator 12 through resistors 22 and 23, respectively having values of 15.1 KΩ and 19 KΩ. Thereby, the source drain current of MOSFET 17 is greater than the source drain current of MOSFET 18 for a particular magnitude of variable voltage source 14.

Bodies 24 and 25 of MOSFET's 17 and 18 are connected directly to the output voltage of regulator 12 to minimize leakage between the drain electrodes of the MOSFET's and the body. Thereby, the impedance between the gate and source electrodes of MOSFET's 17 and 18 is maintained at a very high level; typically the input impedance between the source and gate of each MOSFET is greater than $10^7\Omega$.

The currents derived from drain electrodes 26 and 27 of MOSFET's 17 and 18 are respectively applied to the bases 28 and 29 of bipolar NPN transistors 31 and 32. The base 28 of NPN transistor 31 is also connected directly to the output voltage of regulator 12 by resistor 33, having a value of 50 KΩ, which shunts the source drain path of MOSFET 17. The current supplied to the bases 28 and 29 of transistors 31 and 32 is also respectively fed to the collectors 34 and 35 of transistors 31 and 32 by way of capacitors 36 and 37. Transistors 31 and 32, due to the cross coupling capacitors 36 and 37 connected therewith, comprise the switching elements of a free running multivibrator or relaxation oscillator. The frequency derived by the relaxation oscillator is determined, inter alia, by the amplitudes of the currents supplied to the bases of transistors 31 and 32 by the source drain paths of MOSFET's 17 and 18, as well as the constant current flowing through resistor 33.

The oscillator comprising transistors 31 and 32 is selectively triggered into operation in response to the source drain path of MOSFET 38 being activated to an OFF state in response to the square-wave output voltage of oscillator stop source 39. Current for the emitter collector paths of transistors 31 and 32 is respectively supplied by PNP transistors 41 and 42, the emitters 43 and 44 of which are D.C. coupled to the output voltage of regulator 12. Collectors 45 and 46 of transistors 41 and 42 are directly connected with the collectors of transistors 32 and 32, respectively. The bases and collectors of transistors 41 and 42 are cross coupled by D.C. circuits comprising parallel resistance capacitance networks 47 and 48. The resistances of networks 47 and 48 control the base currents of transistors 41 and 42 while the capacitances provide fast switching between transistors 41 and 42. Shunting the bases and emitters of transistors 41 and 42 are back biased diodes 49 and 50 which perform voltage hold-off and safety functions.

The complementary nature of the free running oscillator, wherein transistors 41 and 42 comprises the collector impedances of transistors 31 and 32, enables the circuit of the present invention to function is response to relatively low drain currents from MOSFET's 17 and 18, as occurs when source 14 has a relatively large amplitude. This result is achieved because the emitter collector paths of transistors 41 and 42 have relatively low impedances and large forward bias in response to small currents being applied to the base circuits of transistors 31 and 32.

To maintain transistors 31 and 42 in oscillation at all times while MOSFET 38 is activated to an OFF state, regardless of the voltage of source 14, a minimum oscillation frequency of the multivibrator comprising transistors 31 and 32 is established by shunting the source drain path of MOSFET 18 with 4 megohm resistor 52. Resistor 52 assures coupling of D.C. current from the output of regulator 12 to the base of transistor 32 regardless of the current in the drain circuit of MOSFET 18.

Figure 2:
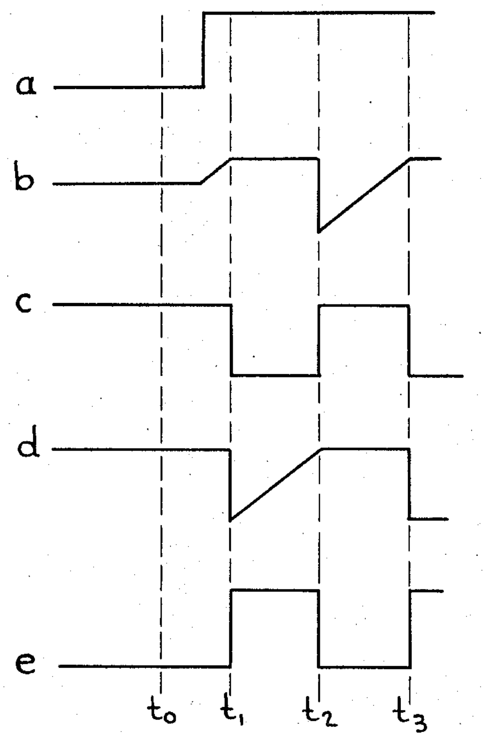

To describe the manner by which the variable frequency, voltage responsive relaxation oscillator of FIG. 1 functions, reference is now made to the waveforms of FIGS. 2*a*–2*e*. Prior to time $t_0$, the base of transistor 32 is short circuited to ground through the drain source path of MOSFET 38 by virtue of the MOSFET being activated to an ON state in response to a zero output voltage of source 39, as indicated by FIG. 2*a*. With the base of transistor 32 short circuited, no current flows between the base and emitter of transistor 32 and a relatively large D.C. voltage exists at collector 35 of transistor 32. The large D.C. voltage at collector 35 is coupled to the base of transistor 41, cutting off transistor 41. With transistor 41 cut off, transistor 42 is activated to a conducting state due to the cross coupling relationship between transistors 41 and 42. In response to transistor 42 being in a conducting state, current is supplied through the emitter collector path thereof. The current which flowed through the emitter collector path of transistor 42 when the transistor was initially turned on prior to $t_0$ was coupled through the capacitor 37 to the base of transistor 31 to turn transistor 31 to an ON condition. The ON condition of transistor 31 is maintained in response to the current supplied by regulator 12 through resistor 33. Thereby, the initial conditions of the transistor relaxation oscillator, with a negative or zero output voltage of oscillator stop source 39, are: transistors 31 and 42 are conducting while transistors 32 and 41 are cut off.

To commence operation of the multivibrator or relaxation oscillator, the output voltage of source 39 undergoes a positive step at time $t_0$, as shown by FIG. 2*a*. In response to the positive step in the output voltage of source 39, the source drain path of MOSFET 38 is pinched off to remove the short circuit between the base and emitter of transistor 32. With the short circuit removed from the base emitter junction of transistor 32, the source drain current of MOSFET 18 and the constant current through resistor 52 flow into the base of transistor 32. The current supplied to base 29 of transistor 32 increases exponentially so as to closely approximate a linear sawtooth, as indicated by FIG. 2*b*. The sawtooth increase in the base current of transistor 32 occurs because capacitor 36 initially drains most of the currents from resistor 52 and the drain electrode of MOSFET 18. As capacitor 36 becomes charged, a greater percentage of the currents flowing through resistor 52 and from the drain of MOSFET 18 flow into base 29. Ultimately, at time $t_1$, the base current of transistor 32 reaches a level sufficiently great to cause the transistor to switch from a nonconducting to a fully conducting state.

The voltage at collector 35 of transistor 32 suddenly drops, as indicated by FIG. 2*d*, in response to the flow of current through the transistor collector emitter path which occurs when the transistor goes from a nonconducting to a conducting state. In response to the decreased voltage at the collector of transistor 32, the base emitter path of transistor 41 is suddenly forward biased resulting in an increase of the collector voltage thereof. In response to the increased collector voltage of transistor 41, the base of transistor 42 becomes back biased to suddenly decrease the voltage at collector 46 of transistor 42. The sudden decrease in voltage at the collector of transistor 42 is coupled through capacitor 37 to the base of transistor 31, cutting off the emitter collector path thereof. Thereby, the voltage at collector 34 of transistor 31 suddenly increases. The sudden increase in the voltage at collector 34 is coupled through capacitor 36 to base 29 of transistor 32 to cause the latter transistor to become conducting to a greater extent. The sequence of events is regenerative, whereby transistors 31 and 32 are rapidly switched from their initial states to the nonconducting and conducting states respectively. Substantially simultaneously, transistors 41 and 42 are switched so that the former is in a conducting state and the latter is in a nonconducting state.

With transistor 28 cut off, no current is supplied through capacitor 36 but all of the drain current of MOSFET 18 and the current flowing through resistor 52 are fed to the base of transistor 32, as indicated by the constant amplitude portion of the waveform of FIG. 2*b* between the times $t_1$ and $t_2$. While a constant amplitude current is being supplied to the base of transistor 32, the base voltage of transistor 31 increases in a sawtooth manner from a negative value thereof, indicated by the waveform of FIG. 2*d*. The charging rate of the transistor 31 base voltage is governed by the value of capacitor 37 which initially draws all of the drain current of MOSFET 17 and resistor 33 through the emitter collector path of transistor 32. As time progresses and charge is accumulated on the electrodes of capacitor 37, a greater amount of current is supplied by the drain of MOSFET 17 and resistor 33 to the base of transistor 31 until transistor 31 becomes conducting. In response to transistor 31 again becoming conductive, the states of transistors 32, 41 and 42 are again switched, whereby immediately after time $t_2$, transistor 32 is cut off while transistors 41 and 42 are respectively cut off and conducting. The sequence of operation described is repeated continuously so that a series of square waves is derived at collector 34 of transistor 31.

It is thus seen that the time interval for which each of transistors 31 and 32 is conducting is dependent upon the values of capacitors 36 and 37, as well as the drain currents of MOSFET's 17 and 18 and the constant currents flowing through resistors 33 and 52, although the current of resistor 52 is of minimum importance because it is very small due to the large impedance of the resistor.

For a maximum voltage of input source 14 of 5.5 volts, the source drain impedances of MOSFET's 17 and 18 cause relatively small currents to flow from drains 26 and 27 to the bases of transistors 31 and 32, respectively. When the drain currents of MOSFET's 17 and 18 are relatively small, the time required for the bases 28 and 29 to draw sufficient current to cause transistors 31 and 32 to be switched is relatively large. As the voltage of source 14 decreases, the source drain impedances of MOSFET's 17 and 18 decrease, whereby greater currents are supplied by drains 26 and 27 to bases 28 and 29, respectively. In response to the greater drain currents of MOSFET's 17 and 18, the states of transistors 31 and 32 are more rapidly switched, whereby the output frequency of the oscillator increases relative to the frequency which is derived in response to higher voltages of source 14.

If only MOSFET's 17 and 18 were utilized for the current supplying elements to the bases of transistors 31 and 32, a nonlinear output frequency versus input voltage relationship would exist because of the inherent nonlinear, square law relationship between MOSFET source gate voltage and source drain current. To compensate for the nonlinear nature of the voltage versus current responses of MOSFET's 17 and 18, the drain current of MOSFET 17 is augmented by the constant current flowing through resistor 33. The relationship between the ON times of transistors 31 and 32 and the voltage of source 14 is such that the two transistors are ON for substantially the same interval for a zero voltage level of source 14. In contrast, for a 5 volt level of source 14, transistor 31 is rendered conducting for only ten percent of each cycle, while transistor 32 is conducting for the remainder of the 90 percent of each cycle. This relationship exists because the drain currents of MOSFET's 17 and 18 are approximately 0.1 the constant current of resistor 33 for input potentials of 5 volts while the MOSFET's drain currents are each approximately the same as the current of resistor 33 for a zero voltage input signal.

By judicious selection of the values of resistors 22, 23 and 33, the linear relationship between the output frequency of the square waves derived at collector 34 and the input voltage of source 14 is achieved. In particular, it can be shown that the output frequency is related to the input signal voltage, the values of resistances 22, 23 and 33, the voltage developed by regulator 12, the values of capacitors 36 and 37 (assumed to be equal) and a characteristic of MOSFET's 17 and 18 as:

$$f_0=\frac{V-V_{in}-V_{gs}}{CV\left(\dfrac{1}{\dfrac{1}{R_1}\dfrac{3V}{2R_3(V-V_{in}-V_{gs})}}+R_2\right)} \qquad (1)$$

where, $f_0$=oscillator output frequency;
V=the output voltage of regulator 12;
$V_{in}$=the voltage of source 14;
$V_{gs}$=the gate source voltage of MOSFET's 17 and 18;
C=the value of each of capacitors 36 and 37;
$R_1$=the value of resistor 22;
$R_2$=the value of resistor 23; and
$R_3$=the value of resistor 33.

For different input signal voltages, the characteristics of MOSFET's 17 and 18 change, as does the output voltage of regulator 12 in response to the variable load current supplied by it to the oscillator. Thereby, for changing values of $V_{in}$, the values of V and $V_{gs}$ in Equation 1 vary. To compensate for the variable values of V and $V_{gs}$ as a function of $V_{in}$ and provide the linear relationship between the multivibrator output frequency and the voltage of source 14, the linearity correction term $$\frac{3V}{2R_3(V-V_{in}-V_{gs})}$$

which represents the contribution of the current through resistor 33, is included in Equation 1. Since the sole function of the nonlinearity correction term is to compensate for the variations of V and $V_{gs}$, Equation 1 can be rewritten as:

$$f_0=\frac{V'-V_{in}-V'_{gs}}{CV'(R_1+R_2)}$$

where:

V'=compensated value of V, and
$V'_{gs}$=compensated value of $V_{gs}$.

As seen from Equation 2, the output frequency of the oscillator varies linearly with variations of input voltage, $V_{in}$. It is noted that any changes in the gate source voltage of MOSFET's 17 and 18 for a predetermined input current is reflected in the oscillator output frequency. It is a characteristic of MOSFET's that the gate source voltage, $V_{gs}$, thereof changes as a function of temperature and radiation level for a predetermined source current. Hence, some type of compensation must be provided to overcome the variable gate source voltage characteristics of MOSFET's 17 and 18 to provide a linear output frequency versus input signal level response. In accordance with another aspect of the invention, the variable gate source voltage characteristics of MOSFET's 17 and 18 are compensated with a specially designed circuit included in regulator 12.

In particular, regulator 12 includes a voltage reference device comprising MOSFET 61, having the source thereof connected to the regulator positive potential output terminal 60 through forward biased diode semiconductor 62, preferably of the silicon type. The body of MOSFET 61 is connected directly to the regulator output voltage, while the MOSFET gate is responsive to a percentage of the regulator output voltage as developed at the tap of resistive voltage divider 63 between resistors 64 and 65.

An amplified replica of the voltage supplied to the gate electrode of MOSFET 61, in signal polarity inverted form, is developed across resistor 66, connected in the drain circuit of the MOSFET. The voltage across resistor 66 is D.C. coupled to the base of NPN transistor 67, which together with NPN transistor 68 forms a differential amplifier. By changing the value of resistor 66 the voltage temperature coefficient of the regulator 12 output voltage is variable as desired because the voltage temperature coefficient of MOSFET 61 is current dependent. The emitters of transistors 67 and 68 of the differential amplifier are connected to ground through a common load resistor 69 while the collectors thereof are biased by the regulator output voltage. The base of transistor 68 is responsive to the voltage at the tap of voltage divider 63, the same voltage which is applied to the gate electrode of MOSFET 61. The voltage at the collector of transistor 68, developed across resistor 72 and proportional to the difference between the base voltages of transistors 67 and 68, is coupled to the base electrode of PNP power transistor 71, the emitter collector path of which serves as a variable impedance for regulating the current supplied between source 13 and output terminal 60 of regulator 12. Bias regulation for the base of transistor 71 is established by resistor 72, shunting the power transistor base collector path. The collector of transistor 71 is connected to ground through A.C. filtering capacitor 73, which stabilizes the transistor collector bias voltage.

In operation, diode 62 sets the source body voltage of MOSFET 61 to approximately the same level as the source body potential of MOSFET's 17 and 18 for low current operation of the oscillator. As temperature changes the source gate and source drain voltages of MOSFET's 17, 18 and 61 have a tendency to vary by the same amount. If diode 62 were not included in the source circuit of MOSFET 61, however, the source drain voltage change of MOSFET 61 would be reflected in the regulator output voltage by a factor on the order of two, for a typical power supply voltage of approximately nine volts. By including diode 62 in the source circuit for MOSFET 61, a voltage drop is provided in series with the MOSFET source drain voltage and the voltage across resistor 66 such that variations in the MOSFET source gate voltage as a function of temperature are reflected in changes in the regulator output voltage to match the voltage variations of the oscillator MOSFET's 17 and 18. It has been found through experimentation that the temperature negative coefficients of many different types of semiconductor diodes help provide the temperature compensation needed to adjust the regulator output voltage to the necessary degree. If, however, the regulator output voltage is not sufficiently high enough for the power supply load an additional diode should be connected in series with diode 62; on the contrary, if the power supply load requires a smaller voltage the diode should be excluded. By matching the power supply variations of source 12 to be approximately equal but opposite to the source gate voltage changes of MOSFET's 17 and 18 the term $(V'-V'_{gs})$ in Equation 2 remains constant as a function of temperature and environmental radiation level.

The gate and drain electrodes of MOSFET 61 are maintained at approximately the same potential in normal operation. Maintaining the gate and drain electrodes of MOSFET 61 at substantially the same potential, and connecting the source and body electrodes to substantially the same voltage level through diode 62 causes the MOSFET to function in a manner similar to a Zener diode reference voltage device. Thereby, a relatively constant voltage exists between output terminal 60 of regulator 12 and the drain electrode of MOSFET 61 so that the current through resistor 66 is indicative of the voltage output of the regulator.

The regulator circuit disclosed by FIG. 1 can be modified as shown by the diagram of FIG. 3, wherein three series connected MOSFET's 81–83 are connected in circuit to be responsive to the voltage across the output terminals of the regulator. By connecting the source drain paths of MOSFET's 81–83 in series and short circuiting the gate electrodes of the three MOSFET's to the drain electrode of MOSFET 83, which is connected to the base of transistor 67, the regulated voltage developed across the three MOSFET's is increased. Thereby, the three MOSFET's of FIG. 3 can be utilized to perform the same function as MOSFET 61 and diode 62 of regulator 12 of FIG. 1. It is noted that the regulator of FIG. 3 does not include the amplification feature of the regulator of FIG. 1 whereby the regulation performance is not as good as the FIG. 1 embodiment.

Consideration is now given to an analysis of the operation of a regulator of the type shown in FIG. 3 in combination with the oscillator of FIG. 1, assuming only one MOSFET in the regulator circuit. Initially assume that the oscillator input signal voltage, $V_{in}$, FIG. 1, decreases so that the source currents of MOSFET's 17 and 18 increase and the regulated output voltage of regulator 12' has a tendency to decrease by some amount ΔV. In the following analysis, the initial voltages of the regulator are indicated as unprimed symbols while the regulator voltages after the incremental change are indicated by double primed symbols. The analysis is made presuming that the collector paths of transistors 67 and 68 draw a negligible current from the regulator output, whereby:

$$V_1=V_{reg}\left(\frac{R_6}{R_5+R_6}\right) \tag{3}$$

where:

$V_1$=the voltage at the tap of voltage divider 63;

$V_{reg}$=the voltage developed by regulator 12 between terminal 60 and ground, and $R_5$ and $R_6$ are the values of resistors 64 and 65, respectively.

The voltage at the base of transistor 67 is:

$$V_2=V_{reg}-V_{mos} \tag{4}$$

where:

$V_2$ is the MOSFET source output voltage developed across resistor 66; and $V_{mos}$=the MOSFET source drain voltage.

With the incremental voltage change, the values of $V_1$ and $V_2$ become:

$$V_1''=(V_{reg}+\Delta V)\left(\frac{R_6}{R_5+R_6}\right) \tag{5}$$

and $$V_2''=(V_{reg}+\Delta V)-V_{mos}'' \tag{6}$$

The change in the inputs of the differential amplifier, at the bases of transistors 67 and 68, in response to the inremental change, ΔV, is:

$$\Delta(V_1-V_2)\doteq(V_1-V_1'')-(V_2-V_2'')=\left(\frac{R_6}{R_5+R_6}\right)(V_{reg}-V_{reg}-\Delta V)-(V_{reg}-V_{mos}-V_{reg}-\Delta V+V_{mos}'') \tag{7}$$

which simplifies to:

$$\Delta(V_1-V_2)\doteq-\left[\left(\frac{R_6}{R_5+R_6}\right)\Delta V-\Delta V-V_{mos}+V_{mos}''\right] \tag{7'}$$

Since the source gate voltage of MOSFET 61 remains substantially constant with variations in the voltage developed by regulator 12, and the values of $R_5$ and $R_6$ can be selected to be approximately equal, Equation 7 representing the change in the input voltages of the differential amplifier can be closely approximated as:

$$\Delta(V_1-V_2)\doteq+\Delta V\left(1-\frac{R_6}{R_5+R_6}\right)=+\frac{1}{2}\Delta V \tag{8}$$

Hence, due to the reference voltage effect of MOSFET 61 and the differential amplifier, the base voltage of transistor changes by one-half of the original incremental voltage change, ΔV, to substantially regulate the output voltage at terminal 60.

The foregoing analysis was made neglecting amplification as introduced by MOSFET 61, FIG. 1, on the output voltage of divider 63. For an analysis of the network of FIG. 1, which includes amplifying MOSFET 61, it cannot be assumed that $V_{mos}\doteq V_{mos}''$, and the amplification factor, $\mu$, of the MOSFET must be considered. With the FIG. 1 regulator, the change in the input voltages of the differential amplifier in response to an incremental change, ΔV, at terminal 60 can be expressed as:

$$\Delta(V_1-V_2)\doteq\left(1-\frac{R_6}{R_5+R_6}\right)(\mu+1)(+\Delta V) \tag{9}$$

For typical values of $\mu$=40 and equal values of $R_5$ and $R_6$, the output of the differential amplifier provides a response 40 times greater than the original incremental output of regulator 12. The gain developed by the MOSFET amplifier enables greater stabilization of the regulator 12 to be achieved than is attained with a circuit of the type previously analyzed.

Reference is now made to FIG. 4 of the drawings wherein there is illustrated a modified version of the MOSFET regulator of the present invention, particularly adapted for use with a negative D.C. voltage supply, rather than positive supplies, as is the case of the regulators of FIGS. 1 and 3. In the regulator of FIG. 4, NPN transistor 91 is connected so that its emitter is responsive to the negative D.C. output voltage of source 92 and its collector supplies negative current to a suitable load 192.

A measure of the load voltage is derived from the tap of voltage divider 93 which includes series connected resistors 94 and 95 shunting the output terminal of the regulator. The output tap of regulator 93 is connected in parallel to the gate electrodes of P-channel MOSFET's 96–98, having their source drain electrodes connected in series between the base of transistor 99 and ground. MOSFET's 96–98 are of the same type as the MOSFET's employed in FIGS. 1 and 3, although they are utilized to regulate negative, rather than positive, supplies. The same type of MOSFET's can be employed in the circuit of FIG. 4 as is employed in FIGS. 1 and 3 because the FIG. 4 MOSFET regulating elements are connected in shunt between the base and ground of the differential amplifier transistor. In contrast, the MOSFET regulators of FIGS. 1 and 3 are connected between the power supply and the base of a transistor comprising the differential amplifier. The utilization of P-channel units MOSFET's is desired because at present all commercial MOS (metal oxide semiconductor) integrated circuits are single polarity P-channel devices.

The amplified replica of the regulator output developed at the drain of MOSFET 96 is developed across load resistor 101, which connects the drain of MOSFET 96 to the collector of transistor 91. Power for transistor 99 of the differential amplifier is provided through the connection of load resistor 102 to the regulator output and the collector of the differential amplifier transistor. The emitters of transistors 99 and 103 of the differential amplifier are connected through a common load resistor 104 to ground, whereby there is developed across resistor 102 a voltage for controlling the impedance of transistor 91 to provide the desired regulation.

While there have been described and illustrated several specific embodiments of the invention, it will be clear that variations in the details of the embodiments specifically illustrated and described may be made without departing from the true spirit and scope of the invention as defined in the appended claims.

I claim:

1. A relaxation oscillator deriving a variable frequency output substantially linearly responsive to the voltage level of a signal source comprising: first and second semiconductor switching elements, each having a control electrode and an output electrode; first and second capacitive means regeneratively connecting said control electrode of said first element with the output electrode of said second element and said control electrode of said second element with the output electrode of said first element; first and second metal oxide semiconductor field effect transistors having source, drain and gate electrodes; means connecting the source drain paths of said first and second field effect transistors in circuit with and for supplying currents to said first and second capacitive means and the control electrodes of said first and second elements respectively; means for connecting the gate electrodes of said field effect transistors to be responsive to said signal source so that the currents supplied to said capacitive means and control electrodes are varied in response to the voltage level of said source; and means for supplying a predetermined D.C. current in parallel with the current of said first transistor to said first capacitive means and the control electrode of said first element, said D.C. current being approximately ten times greater than the minimum source drain current and approximately equal to the maximum source drain current, whereby said oscillator frequency output will be substantially linear in response to the voltage level of said signal source.

2. The oscillator of claim 1 wherein both of said elements are bipolar transistors of a first conductivity type, and said regenerative means includes a second pair of bipolar transistors of a second conductivity type, each of said second conductivity type transistors supplying collector current to one of said first and second elements.

3. The oscillator of claim 1 further including first and second D.C. impedance means in the source drain paths of said first and second field effect transistors, said impedances having values selected so that the source drain currents of said transistors are different for the same voltage being applied to the field effect transistor gate electrodes.

4. The oscillator of claim 1 wherein said impedances are connected between the source electrodes of the field effect transistors and a D.C. power supply terminal, and further including means for connecting the bodies of said field effect transistors directly to the terminal.

5. The oscillator of claim 1 further including a regulated D.C. power supply having a terminal for feeding currents to the source drain paths of said first and second transistors, said supply including a third metal oxide field effect transistor connected in shunt with said terminal.

6. The oscillator of claim 5 wherein the regulator includes a differential amplifier having one input responsive to a percentage of the D.C. voltage at said terminal and a second input responsive to the voltage between the source and drain electrodes of said third field effect transistor, and a variable impedance in series with said terminal controlled in response to the differential output of said differential amplifier.

7. The oscillator of claim 6 wherein the gate electrode of the third field effect transistor is responsive to a portion of the D.C. voltage at said terminal.

8. The oscillator of claim 7 further including forward biased diode means connected in D.C. circuit between said terminal and the source electrode of said third field effect transistor.

9. The oscillator of claim 8 further including first and second D.C. impedance means in the source drain paths of said first and second field effect transistors, said impedances having values selected so that the source drain currents of said transistors are different for the same voltage being supplied to the gate electrodes of said field effect transistor to provide a linear output voltage versus input voltage level response.

10. The oscillator of claim 9 wherein said impedances are connected between the source electrodes of the field effect transistors and a D.C. power supply terminal and further including means for connecting the bodies of said field effect transistors directly to the terminal.

11. The oscillator of claim 5 further including forward biased diode means connected in D.C. circuit between said terminal and the source electrode of said third field effect transistor.

References Cited

UNITED STATES PATENTS

| | | | |
|---|---|---|---|
| 3,327,301 | 6/1967 | Reich | 331—113 |
| 3,371,269 | 2/1968 | Wattson | 321—18 |

OTHER REFERENCES

Electronic Design, p. 67, Apr. 11, 1968.

JOHN KOMINSKI, Primary Examiner

U.S. Cl. X.R.

321—18; 323—22; 331—144